United States Patent [19]

King

[11] 4,028,206
[45] June 7, 1977

[54] METHOD FOR COOL DEPOSITION OF LAYERS OF MATERIALS ONTO A SUBSTRATE

[76] Inventor: William James King, 9 Putnam Road, Reading, Mass. 01867

[22] Filed: Mar. 10, 1976

[21] Appl. No.: 665,857

[52] U.S. Cl. .................. 204/192 C; 204/192 P; 427/40; 427/42; 427/164; 427/250; 427/248 R
[51] Int. Cl.² ............................... C23C 15/00
[58] Field of Search ............ 204/192; 427/38–41, 427/50, 162–167, 250, 109, 124, 125

[56] References Cited

UNITED STATES PATENTS

| | | | |
|---|---|---|---|
| 2,761,945 | 9/1956 | Colbert et al. | 219/19 |
| 3,694,337 | 9/1972 | Kushihashi et al. | 204/192 |
| 3,793,167 | 2/1974 | Glaser | 204/298 |
| 3,798,146 | 3/1974 | Wan et al. | 204/192 |
| 3,826,728 | 7/1974 | Chambers et al. | 204/192 |

Primary Examiner—John H. Mack
Assistant Examiner—Aaron Weisstuch
Attorney, Agent, or Firm—Russell & Nields

[57] ABSTRACT

In systems in which material is deposited on a substrate in such a way that substantial heating of the substrate by radiant transmission occurs, such heating is reduced by first depositing a material capable of reflecting a significant fraction of the incident thermal radiation.

6 Claims, 3 Drawing Figures

METHOD FOR COOL DEPOSITION OF LAYERS OF MATERIALS ONTO A SUBSTRATE

BACKGROUND OF THE INVENTION

Materials such as plastics are commonly used for a large number of applications because of their lightness, moldability, transparency (for optical applications), workability etc. However, for many applications such as building materials (e.g. decorator panels), lightweight mirrors, windows, etc., they are relatively unsuitable because of their susceptibility to scratching and lack of resistance to chemical environmental attack. Such restrictions can be partially removed by the addition of a protective layer of glass or other suitable material on the surface or surfaces exposed to attack. Two primary difficulties exist in applying such protective layers, the first being that of achieving a sufficiently good bond between the materials, and the second being that of keeping the plastic sufficiently cool during application of the protective material to avoid deformation, melting, or surface hazing of the plastic. Furthermore, delamination (i.e. separation between the substrate layer and the protective layer) may occur upon cooling after the deposition process. The heated plastic and glass will expand during the application process, but at different rates due to different thermal coefficients of expansion. After the application process the glass and plastic will want to return to their unheated size. Again due to the different thermal coefficients of expansion, the plastic will want to contract more in size than the glass, resulting in great shearing forces. Therefore, unless the bond between the layers is sufficiently strong, delamination will occur. One means for reducing the high shear force upon contraction is to keep the plastic sufficiently cool during the aplication process. In this manner the plastic will experience small expansion before the deposition, resulting in small contractive forces upon cooling after the deposition.

The bond difficulty can be overcome by using graded bonding techniques such as ion beam implantation sputtering, etc. as disclosed in my Disclosure Document No. 032867, filed June 5, 1974. The overheating difficulty can be overcome by adjusting the deposition rate of a given process to the point where the energy input is below that required to raise the plastic above the deformation, melting, delamination, or surface hazing point, but for many applications the result is intolerably slow rates. The overheating difficulty can also be overcome by cooling the plastic during attachment of the glass. These two methods of dealing with the overheating problem are used if it is necessary that the protective layer be transparent and that the incoming light be unimpeded (as with non-absorbing glass) as the light passes through the structure. If, however, the application for the structure can tolerate or needs coloration as viewed from the protective layer side, or if it is to provide coloration and to control the amount of transmitted light (as in the coapplication "Light Control With Color Enhancement", Ser. No. 645,262 filed Dec. 29, 1975), the present invention allows the protective layer to be applied, if suitable application methods are used, without the need for cooling the plastic substrate and/or such that the tolerable deposition rate can be significantly increased.

With respect to a generalized deposition system, if the deposition system involves evaporation, plasma deposition or other similar methods, the source of the depositing material is either quite hot itself and/or it emits hot material. For example, evaporation uses very hot sources, which give off large quantities or radiant heat to the substrate and surrounding walls etc. and which also emit material having high thermal energy although small kinetic energy. On the other hand, systems such as cathode or radio frequency sputtering etc. have sources or emitters which can be cooled, so that the emitted material has much lower thermal energy albeit somewhat higher kinetic energy. Generally, however, in practical systems of this type difficulties in cooling the cathode (source) lead to somewhat elevated cathode temperatures of a few hundred degrees centigrade or more. More importantly, the substrates are bombarded with many energetic electrons which are extracted from the residual plasma by the potential on the substrates (or repelled by the cathode), thereby raising the substrate temperature significantly and frequently above tolerable levels. In ion plating, the substrates are bombarded with energetic ions which are used in maintaining a clean surface during deposition on the substrate.

In ion beam sputtering (IBS) (U.S. Pat. No. 3,472,751) or ion beam implantation sputtering (IBIS) (Disclosure Document No. 032867 filed June 5, 1974) the prime source of heat to the substrate is radiant heat from the ion beam target (source) since the space between the target and substrates is a good vacuum and relatively free of "residual" ions and electrons, and the emitted material has relatively low thermal energy, although relatively high kinetic energy. This kinetic energy, in practical IBS or IBIS systems, is usually not the prime factor in substrate heating. For deposition systems such as these, where the major source of heat to the substrates is infrared radiant energy from the source, the limiting factor on the deposition rate is normally the amount of heat (in the form of beam energy) brought into the target by the ion beam minus that removed by direct target cooling and/or radiation. This difference value determines the target temperature and therefore the net amount of radiated heat transferred from the target to the substrate. The object of the present invention is to permit a high rate of deposition onto the substrate without the need for cooling, while maintaining the substrate below its critical limiting temperature of deformation, melting, delamination, or surface hazing.

SUMMARY OF THE INVENTION

The present invention comprehends a method of applying layers of materials onto surfaces while keeping the surfaces sufficiently cool during application of the material to avoid deformation, melting, delamination or surface hazing. The method of the present invention is a two step process. First, a layer of material which is highly reflecting in the thermal radiation region is deposited onto the substrate. Because of the thermal radiation reflectivity, the temperature of the substrate will be lower for any deposition rate. Likewise, for a given limiting temperature of deformation, melting, or surface hazing of the substrate the increased thermal radiation reflectivity permits an increased rate of deposition. Since the degree of thermal radiation reflectivity increases with the thickness of the reflecting layer up to a limiting value, the permissible rate of deposition of the reflecting layer also increases with the thickness of the reflecting layer. With respect to the second step of the method of the present invention, successive layers of various materials are deposited onto the thermal radiation reflecting layer. The successive layers are deposited at a rate greater than that permissible without the presence of the thermal radiation reflecting layer. Likewise, the presence of the thermal radiation reflecting layer results in a lower temperature of the substrate for any given rate of deposition of the successive layers of material.

DETAILED DESCRIPTION OF THE PREFERRED EMBODIMENTS

Figure 1:
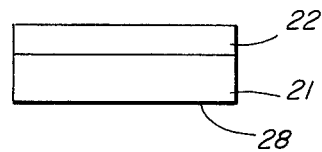
FIG. 1 is a schematic view of the target and substrate before ion beam sputtering.

The preferred embodiment of the present invention comprehends deposition of materials onto a plastic substrate by ion beams sputtering (IBS). A metal layer is first deposited, said layer having significant transmission in the visible region but having high reflectivity in the infrared region. A protective dielectric layer such as silicon dioxide (glass) is then deposited over the metal layer.

The theory underlying the present invention is as follows. In the case of ion beam sputtering, if the target (source) and substrate are at temperatures $T_T$ (assumed maintained constant by energy input from the ion beam) and $T_S$ respectively, and are considered to be surrounded by an infinite vacuum, the major energy transferred between them is by direct radiation (i.e., very little is conducted and none is absorbed and re-radiated by the surrounding medium or other objects to the target or substrate). Assume for simplicity that the substrate is the same size or larger than, and aligned with, the substrate holder. This idealized energy transfer from the target to the substrate is given by a modified form of the Stefan-Boltzmann Law, via:

$$Q = CF_A F_\epsilon A (T_T^4 - T_S^4) \quad (1)$$

where
$Q$ = net amount of heat transferred per unit time between target and substrate
$C$ = constant
$F_A$ = a view factor allowing for the average solid angle through which the target and substrate see each other; i.e., it allows for relative areas and positions of the target and the substrate
$F_\epsilon$ = emissivity factor allowing for relative emissivities ($\epsilon$) of the target and the source
$A$ = area of the target.

Since the target temperature in a practical system is generally much higher than the substrate temperature, the net energy transfer is from the target to the substrate, tending to raise the temperature of the latter. For given temperatures $T_T$ and $T_S$, since $C$, $F_A$ and $A$ are fixed, the only factor in equation (1) that can be changed to decrease the net heat transfer is $F_\epsilon$. In general, $F_\epsilon$ decreases as either $\epsilon_T$ (emissivity of target) or $\epsilon_S$ (emissivity of substrate) decreases. The exact form of $F_\epsilon$ depends on the geometry etc. of the system. Assume, for purposes of explanation, that the target is a black body with $\epsilon_T = 1$, and that the system attains an equilibrium condition with target and source at $T_T$ and $T_S$ respectively. At equilibrium Kirchoff's Law implies that the emissivity and absorptivity of a body are equal and at a value determined only by its temperature. For the present case, this means that for given values of Q and $T_T$, to decrease $T_S$ (i.e. to increase $T_T^4 - T_S^4$) one must decrease $F_\epsilon$ by decreasing the emissivity of the substrate, which is the same as decreasing its absorptivity.

Since the sum of the absorptivity, (A), transmissivity ($t$) and reflectivity (R) be 1, A and/or $t$ can be decreased by increasing R. Depending on the actual values involved, this means that some of the radiant energy that was given off by the much hotter target and absorbed and reemitted by the substrate (at an increased temperature) and partly reabsorbed by the target (percentage depends on geometry) is now directly reflected back to the target to be reabsorbed.

The mechanism can best be understood by considering a substrate mounted on a holder which is sufficiently well cooled that its temperature rises only slightly under the radiant heat load from the target. Consider also a substrate having low or zero reflectivity on the side facing the radiating target. If the substrate temperature rises appreciably above the temperature of the cooled holder, the absorptivity of the substrate must be non-zero, since neither the reflected, nor the transmitted components will raise the substrate temperature. In other words, in the general "practical" case, for a rise in substrate temperature one cannot have the case where R plus $t$ equals 100% and A is zero. It should also be noted that even for a low absorption material, such as many plastics, the temperature of the substrate will continue to rise above that of the substrate holder until an equilibrium is reached with thermal conduction to the substrate holder and/or radiant emission to the substrate holder, target, etc.

Next consider the case where a layer of material, $m$, (e.g. copper or brass), having high reflectivity ($R_m$) in the infrared region, is applied to the surface of the substrate, and assume that the layer is thin so that absorption of the non-reflected incident infrared radiation is small (as in coapplication "Light Control with Color Enhancement"). For the non-reflected part of the incident infrared radiation which is transmitted (designated by $t_m$) to the original substrate, a component of magnitude $tt_m$ will be transmitted to the substrate holder and a component of magnitude $At_m$ will be abosrbed in the substrate. Now, $t_m$ is less than 100 percent of the incident radiation onto the substrate since $R_m$ is non-zero and of significant amplitude. Therefore, the component ($tt_m$) transmitted to the substrate holder is smaller than the component $t$ for the case without the reflection layer. More importantly, the absorbed component $At_m$ is also smaller than it corresponding component A in the non-reflecting case.

The "composite" structure may be considered as now having higher reflectivity and lower transmissivity and absorptivity than in the original case. It is possible to postulate a case in which the absorptivity of the applied reflecting layer is greater than that of the original substrate so that more energy is absorbed than originally, causing the substrate to heat due to conduction from the hotter metal layer. However, this is not the general case encountered in the practice of this invention. Although one can postulate other cases such as a non-cooled substrate holder, non-zero original reflectivity R, internal reflection (e.g. at the back surface of the substrate) etc., the general conclusion is the same: less energy is absorbed by the composite structure in the increased reflectivity case.

Q can thus be the same in the two cases, while $F_\epsilon$ is decreased and $(T_T^4 - T_S^4)$ is increased (i.e. $T_S$ decreases if $T_T$ is constant), in the case of increased reflectivity. In essence, the transition stage of absorption and reemission by the substrate is avoided. In fact, the two cases may not be precisely the same; e.g. target temperature may be slightly higher due to increased return of energy to the target by reflection rather than by radiation (due to different solid angle effects) etc. However, in general, the change in substrate temperature for a given set of conditions will take place as discussed above and only minor modifications in the above theory are required to accommodate the variations in deposition conditions that occur in practicing the invention.

If the substrate is modified to have such an increased reflectivity in the direction facing the target, then non-absorbing or low absorbing (particularly in the infrared region) layers of other relatively low reflecting materials such as thin silicon dioxide can be applied to the surface at much higher rates than would be possible without the reflecting layer. Likewise, for a given rate of deposition, the temperature of the substrate can be considerably reduced. (Note: Plastics are normally thought of as non-absorbers in the infrared region, due to the fact that near infrared radiation, such as that present in the solar spectrum, is usually being considered. They do, however, have many absorption bands throughout the infrared region. Fused silica, on the other hand, is thought of as an infrared absorber, since the uses are usually scientific and medium to far infrared radiation is being considered. However, the absorption is not 100%, and in very thin layers silica can be reasonably transparent in the infrared region depending on the particular wavelength. The absorption of silica in the practice of this invention is dependent on the target temperature, which can be in the range of 300°–900° K or more, with a corresponding peak emissions at 10 microns down to approximately 3 microns. The actual situation encountered in the practice of the present invention, such as making sunglasses as described below, is such that the relatively thick layers of plastics used as the substrate have absorptivities high enough to cause significant heating, while the overcoating silica layers, which are three to four orders of magnitude thinner, have relatively low absorptivities. Precise values in any particular situation depend critically on the substrate material, glass material, target temperature, etc.)

Figure 2:
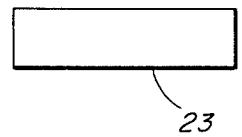
FIG. 2 is a schematic view of the metal target and the substrate during deposition of the metal onto the substrate via ion beam sputtering.
Figure 2:
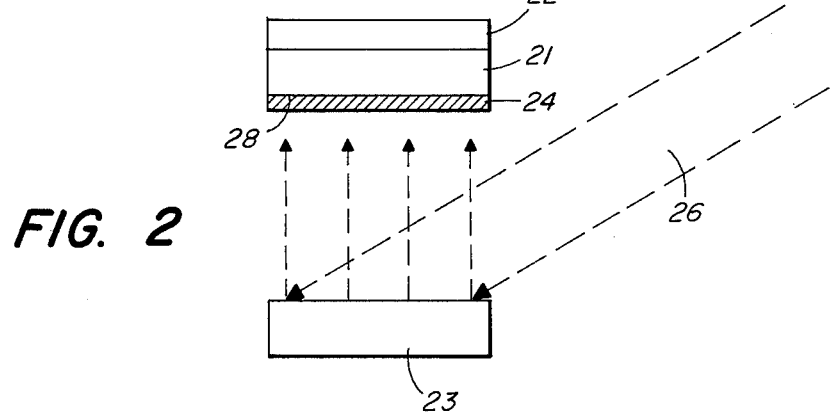
Figure 3:
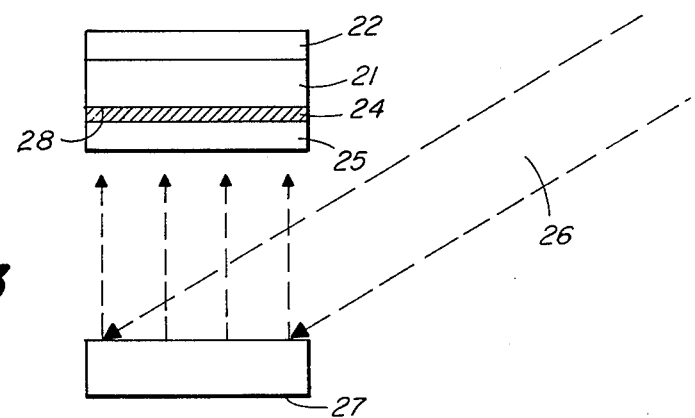
FIG. 3 is a schematic view of the dielectric target, the substrate, and the metal layer during deposition of the dielectric onto the metal layer via ion beam sputtering.

As an example of the practical method, consider coating plastic substrates for application such as sunglass lenses having the structure as described in the coapplication "Light Control with Color Enhancement", Ser. No. 645,262 filed Dec. 29,1975. This invention, as demonstrated, is as follows. As shown in FIGS. 1 through 3 of the accompanying drawing, the plastic substrate 21 is mounted by means of any suitable holding mechanism 22 (such as double backed tape or clips) allowing the surface 28 to be unobstructed and to see the target (source) 23. It is desired to coat the surface 28 of the plastic substrate 21, which may be clear or partially absorbing in the visible, with a partially-reflecting (so called semi-reflecting) layer of a metal 24 overcoated with a dielectric layer 25 of silicon dioxide or other suitable material to provide a colored reflecting metallic appearance and to reduce the amount of visible and infrared radiation reaching the eye. As described in the coapplication "Light Control with Color Enchancement", it is possible to deposit a metal layer 24 having significant transmission in the visible region (e.g. 50–80%) while still being highly reflecting in the infrared region (e.g. 70–95%). For the type of deposition system used, in this case IBS, the maximum permissible power in the form of a high energy ion beam 26 which can be pumped into the target 23 is known. The deposition rate has a limiting value, for the temperature of the target 23 must be kept below the level at which the heat radiating from the target 23 would cause the substrate 21 to melt, deform, delaminate or optically haze.

The initial rate for deposition of the metal layer 24 is adjusted to a value at or below the limiting value. As the metal layer 24 builds up on the plastic substrate 21, the layer already deposited begins to reflect part of the infrared radiation incident from the target away from the substrate (assuming the metal is inherently infrared reflecting). Examples of suitable metals having high infrared reflectivities in polished form include copper, brass, gold, silver, and aluminum. The deposition rate for the metal may then be increased to a rate corresponding to the lower equilibrium temperature of the substrate as discussed above. In fact, this means that the temperature of the target 23 will increase due to the greater energy input of the ion beam 26, causing the temperature of the substrate 21 to go up also. However, for a temperature of the substrate 21 at the same value as it was before the substrate 21 had significant infrared reflectivity, the rate of deposition is now higher. The rate of deposition can be increased quite significantly for a layer which has a much higher infrared reflectivity than it had initially. Exact values for changes in the deposition rate depend on the metal being deposited, system geometry, target cooling, etc.

When the metal layer 24 reaches the thickness required for the desired visible transmission (if any) and/or coloring effects, the metal deposition is stopped. As shown in FIG. 3, a glass target 27 (such as $SiO_2$) is substituted for the metal target 23 in the IBS deposition system, usually but not necessarily without breaking vacuum, and a dielectric layer 25 is deposited over the metal layer 24. Since the dielectric 25 has low infrared absorpitivity in thin layers, even if colored, the infrared radiation from the glass target 27 is still reflected by the metal layer 24. The glass layer 25 can thus be deposited at a rate which is much higher than would be the case if the metal layer 24 were not present. The present invention thus allows a much larger number of lenses etc. to be coated to a given thickness to be obtained in a given amount of time with the substrate 24 at much lower temperatures. Very importantly, the method allows production quantities of lenses, plastic building materials, glass protected front surface plastic mirrors or other similar products to be produced without the need for cooling the substrate during deposition.

The method may also be practiced in other ways. For example, the reflecting metal layer may be deposited at much higher rates in on-off intervals. During the on periods the target temperature is never allowed to get high enough to heat the substrates above the deformation, melting, delamination, or surface hazing point. During the off periods the target cools. The ratio of on time to off time may increase as the deposited metal gets thicker, and once the metal layer reaches the desired thickness the glass may be deposited at the maximum rate. Other forms of the method will be obvious to those skilled in the art.

The method also works for other substrate materials, for other dielectric materials, and for other deposition methods such as ion beam implantation sputtering. The important feature is that the rate of deposition, either continuous or average (in pulsed operation), be adjusted as a function of infrared reflectivity of the reflective materials to maintain the substrates at or lower than the highest allowable temperature. The required region or regions of infrared reflectivity of the reflective material must, of course, be those conforming to the temperature and radiation spectrum of the target. For example, a target at 500° C has a radiation peak at a wavelength of approximately 3.8 microns and the infrared reflectivity of the reflective material must be high at this and surrounding wavelengths. Conversely, for a metal layer having a given reflectivity characteristic, the temperature of the target must be adjusted to the appropriate temperature in order to optimize the technique.

It should be noted that the method is valid for practical systems as well as the perfect system of source and substrate in an infinite vacuum as discussed above. It is obvious that the reflecting layer will act to reflect radiant heat coming from sources other than the target allowing a proportionate increase in the deposition rate and/or a decreased substrate temperature.

Other structures and combinations, such as more than one metal layer, more than one dielectric layer and/or other combinations will be obvious to those skilled in the art. The method may, of course, be used for any application where it is desired to keep the substrate cool and/or increase the deposition rate.

Having thus described the principles of the invention, together with several illutrative embodiments thereof, it is to be understood that, although specific terms are employed, they are used in a generic and descriptive sense and not for purposes of limitation, the scope of the invention being set forth in the following claims.

I claim:

1. In deposition processes wherein at least one layer is deposited upon thermally degradable substrates including plastic substrates in such a way that substantial degradation including deformation, melting, delamination or surface hazing of the substrate is caused by radiant heat transmission in the absence of a reflective material, the method of reducing radiant heating of the substrate which comprises depositing upon said substrate a reflective material which reflects a significant fraction of the thermal radiation incident upon said substrate during the deposition process and subsequently depositing upon said substrate said layer at a rate which is less than that which will cause degradation of the substrate but which is at least as great as that which would have caused degradation of the substrate in the absence of said reflective material.

2. A method according to claim 1 wherein said layer comprises said reflective material.

3. A method according to claim 1 wherein said layer comprises a material substantially transparent to said significant fraction of said thermal radiation.

4. A method according to claim 1 wherein said reflective material is deposited at a rate which increases in proportion to the thickness of said reflective material deposited on said substrate until the desired reflectivity is reached.

5. A method according to claim 1 wherein said deposition process includes the step of bombarding a target with an ion beam so as to cause sputtering of the target material which is then deposited on the substrate.

6. A method according to claim 5 wherein the temperature of said target is adjusted to enhance conformity between the pattern of the spectrum of thermal radiation from said target and the pattern of the spectrum of reflectivity of the reflective material.

* * * * *